(12) United States Patent
Chase et al.

(10) Patent No.: US 7,114,136 B2
(45) Date of Patent: Sep. 26, 2006

(54) METHOD FOR VLSI SYSTEM DEBUG AND TIMING ANALYSIS

(75) Inventors: Harold W. Chase, Cedar Park, TX (US); Daniel R. Knebel, Carmel, NY (US); Dennis G. Menzer, Bedford Hills, NY (US); Stanislav Polonsky, Mohegan Lake, NY (US); Pia N. Sanda, Chappagua, NY (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 10/663,020

(22) Filed: Sep. 16, 2003

(65) Prior Publication Data

US 2005/0262454 A1    Nov. 24, 2005

Related U.S. Application Data

(63) Continuation of application No. 09/406,664, filed on Sep. 27, 1999, now abandoned.

(51) Int. Cl.
*G06F 17/50* (2006.01)
(52) U.S. Cl. ............................................. 716/4; 716/6
(58) Field of Classification Search ............ 716/4, 716/5, 6
See application file for complete search history.

(56) References Cited

U.S. PATENT DOCUMENTS

| | | | | | |
|---|---|---|---|---|---|
| 5,682,104 | A | * | 10/1997 | Shido | 324/751 |
| 5,825,191 | A | * | 10/1998 | Niijima et al. | 324/751 |
| 5,940,545 | A | * | 8/1999 | Kash et al. | 382/312 |
| 6,608,494 | B1 | * | 8/2003 | Bruce et al. | 324/752 |
| 6,650,768 | B1 | * | 11/2003 | Evans et al. | 382/145 |

OTHER PUBLICATIONS

Howard, R.E. et al., "Single Electron Switching Events in Nanometer-Scale Si MOSFET's", IEEE Transactions on Electron Devices, vol. ED-32, No. 9, Sep. 1985, pp. 1669-1674.*

* cited by examiner

*Primary Examiner*—Jack Chiang
*Assistant Examiner*—Magid Y. Dimyan
(74) *Attorney, Agent, or Firm*—Scully, Scott, Murphy & Presser; Marian Underweiser, Esq.

(57) ABSTRACT

A method for characterizing circuit activity in an IC. Generally, the method comprises the steps of activating an IC, resolving the switching activity in space and time, and generating a representation of the switching behavior which differentiates the time that circuits or transistors switch. One embodiment of the invention, utilizes a method such as, but not limited to, time resolved photon emission to observe transistor level switching activity in an integrated circuit (IC).

45 Claims, 6 Drawing Sheets

METHOD FOR VLSI SYSTEM DEBUG AND TIMING ANALYSIS

This application is a continuation of application Ser. No. 09/406,664, filed Sep. 27, 1999, now abandoned.

FIELD OF THE INVENTION

The invention relates to the analysis of operating integrated circuits.

BACKGROUND OF THE INVENTION

There has been no known method for direct observation of circuit activity at a transistor level within an Integrated Circuit (IC) during operation in a system environment (e.g., while operating as a computer) Observation of the internal switching behavior during normal operation of an IC would greatly enhance the IC industry capability to bring reliable product to market faster. The initial debug phase of a computer, referred to as "system bring-up" is extremely important to execute rapidly, as the length of time a system is in bring-up gates introducing the system to market. The identity and behaviour of individual transistors contributing to faulty system operation is not generally available by conventional means and is enabled by this invention. Timing related failures are particularly difficult to isolate to their root cause by conventional means. This invention describes a means for performing logic and timing analysis within circuit components. It relates to the commonly owned and co-pending U.S. patent application Ser. No. 08/683,837, entitled NONINVASIVE OPTICAL METHOD FOR MEASURING INTERNAL SWITCHING AND OTHER DYNAMIC PARAMETERS OF CMOS CIRCUITS, filed Jul. 18, 1998, which describes the basic technique. The present invention describes a system and method which can utilize this new technology for system bring-up as well as characterization and diagnostics in either a system environment or a conventional tester-based environment.

SUMMARY OF THE INVENTION

It is an objective of this invention to provide a means for debugging operational failures at the detailed circuit level, during operation of a chip, in a chip-test or system environment, such as for a microprocessor functioning on a chip test environment or system board. It is a further objective of this invention to provide a means for characterizing and analyzing chips at the circuit and transistor level to optimize for system performance such as frequency, power, etc.

In one embodiment of the present invention, these objectives are accomplished by utilizing a method such as, but not limited to, time resolved photon emission to observe transistor level switching activity in an integrated circuit (IC). For example, a fault would be detected and localized to a circuit element, set of circuits, or to a functional region by using architectural verification instruction sets or other known means of providing stimulus. Knowledge of the circuits which contribute to the tree of logic participating in the failure is used to localize the physical region of interest on the IC and to generate an instruction sequence or test vectors to produce the failure. Time resolved light emission is then collected from the circuits and analyzed to extract switching and timing information which is then compared to expected switching and timing behavior. Logical errors can be debugged this way, such as by detecting a missing switching event or a switching event that should not have occurred. Timing errors can also be debugged in this way, such as by detecting an early or late timing event, or in the case of a critical race condition, a missing switching event or a switching event that should not have occurred.

While the preferred embodiment describes the characterization of circuits with known improper behavior, those skilled in the art will also appreciate that the method also applies to the characterization of circuits not known to demonstrate improper behavior.

DETAILED DESCRIPTION OF A PREFERRED EMBODIMENT OF THE INVENTION

The IC can be tested in accordance with this invention while operating in a system or test environment. In the system environment, the IC is mounted in its system board which may be stimulated with the aid of a service processor such that a sequence of instructions and data are delivered to the IC. Alternatively, the IC may be in its operating environment without an external service processor, such that the system board is mounted in a way that the IC is accessible for observation and the system is executing a program under which the IC is to be tested. In the test environment, the IC is mounted in a test board which is stimulated by a conventional IC tester. In either case, for currently available emission methods, the test cycle must be sufficiently short and exercised repeatedly to provide ample signal over reasonable test times, however future technology may allow longer measurement cycles. In the discussion that follows, the IC is a microprocessor IC, but may in general be any type of IC(s)

Figure 1:
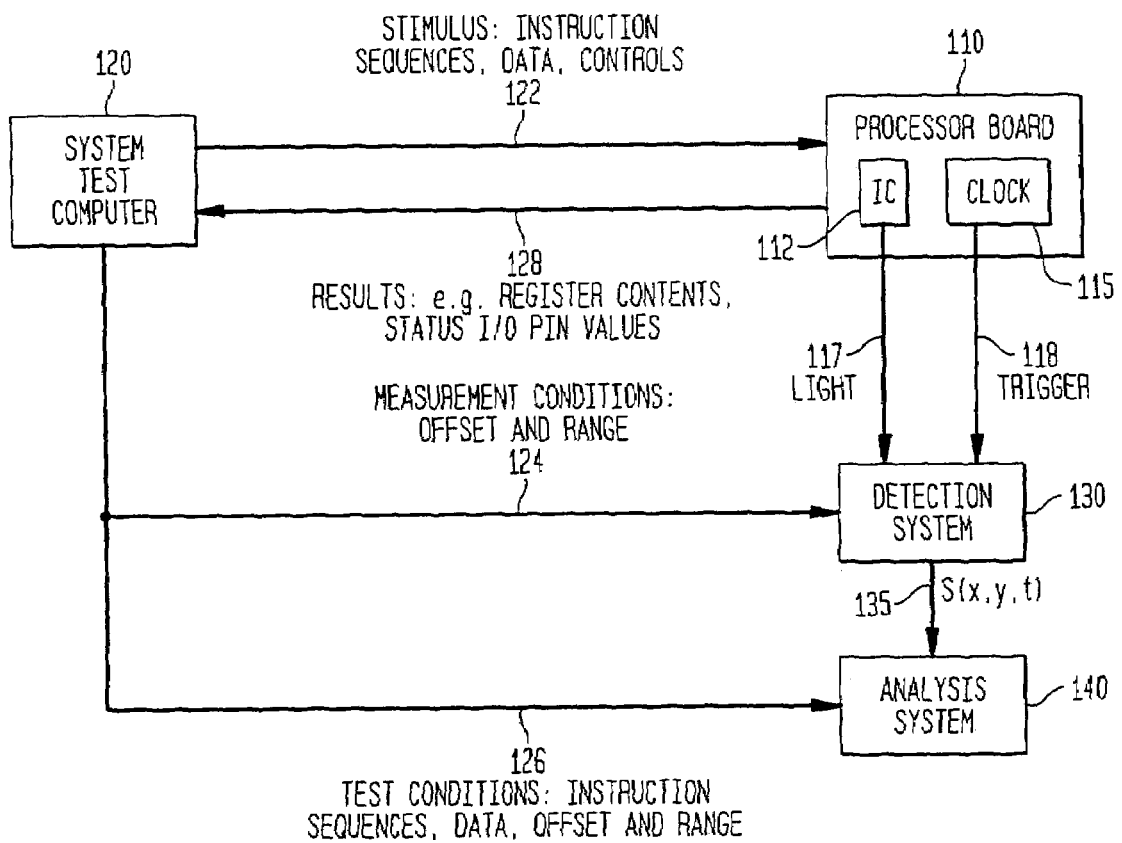
FIG. 1 depicts an example of a block diagram of a test system in accordance with the present invention.

FIG. 1 depicts an example system in block diagram form wherein an integrated circuit (IC) (112) is mounted on a processor board (110), which is connected to a system test computer (120) which loads stimulus (122): instruction sequences and data into the IC's memory and control signals to the processor board. The system test computer also receives results (128): for example register contents, status and input/output (I/O) pin values from the processor board (110). The system test computer also passes measurement parameters (124), for example offset and range parameters to an optical detection system (130), which collects and records the optical data (117) of interest (described in more detail below) and passes photon data S(x,y,t) (135) to an analysis system (140). The system test computer (120) passes test conditions (126): instruction sequences, data, offset and range values to the analysis system (140). Those skilled in the art will appreciate that although the system test computer is shown as a single computer, it could comprise two or more computers performing the functions described above. In another example, the system test computer might be as generic as running any typical program, such as a flight simulator, on a standard computer board under standard debug software.

The analysis system (140) creates the relevant data representations, such as images, waveforms, comparisons to golden data, and may perform logic interpretation functions to reduce the data. The system preferably includes a clock (115) which can generate a trigger (118), e.g., to indicate an origin from which the collected timing information may be referenced. The trigger may be derived from the processor board clock, or from an output of the IC being evaluated.

In an embodiment of the invention, one or more of these data representations are visualized as views within an IC design viewer. These views may be related to each other and to the IC design views by means such as device element parameterization. Cross probing between two or more views further enhances analysis.

In a preferred implementation of the invention, the observation of a chip activity will be made with an optical tool, such as that described in commonly owned and co-pending U.S. patent application Ser. No. 08/683,837, entitled NON-INVASIVE OPTICAL METHOD FOR MEASURING INTERNAL SWITCHING AND OTHER DYNAMIC PARAMETERS OF CMOS CIRCUITS, filed Jul. 18, 1996 (also called "PICA"), which is hereby incorporated by reference herein in its entirety.

The invention may be embodies such that the emission images are viewable within an IC viewer and may be further embodied such that the emission regions are assigned to devices of the IC, such as transistors and other circuit elements.

Figure 2:
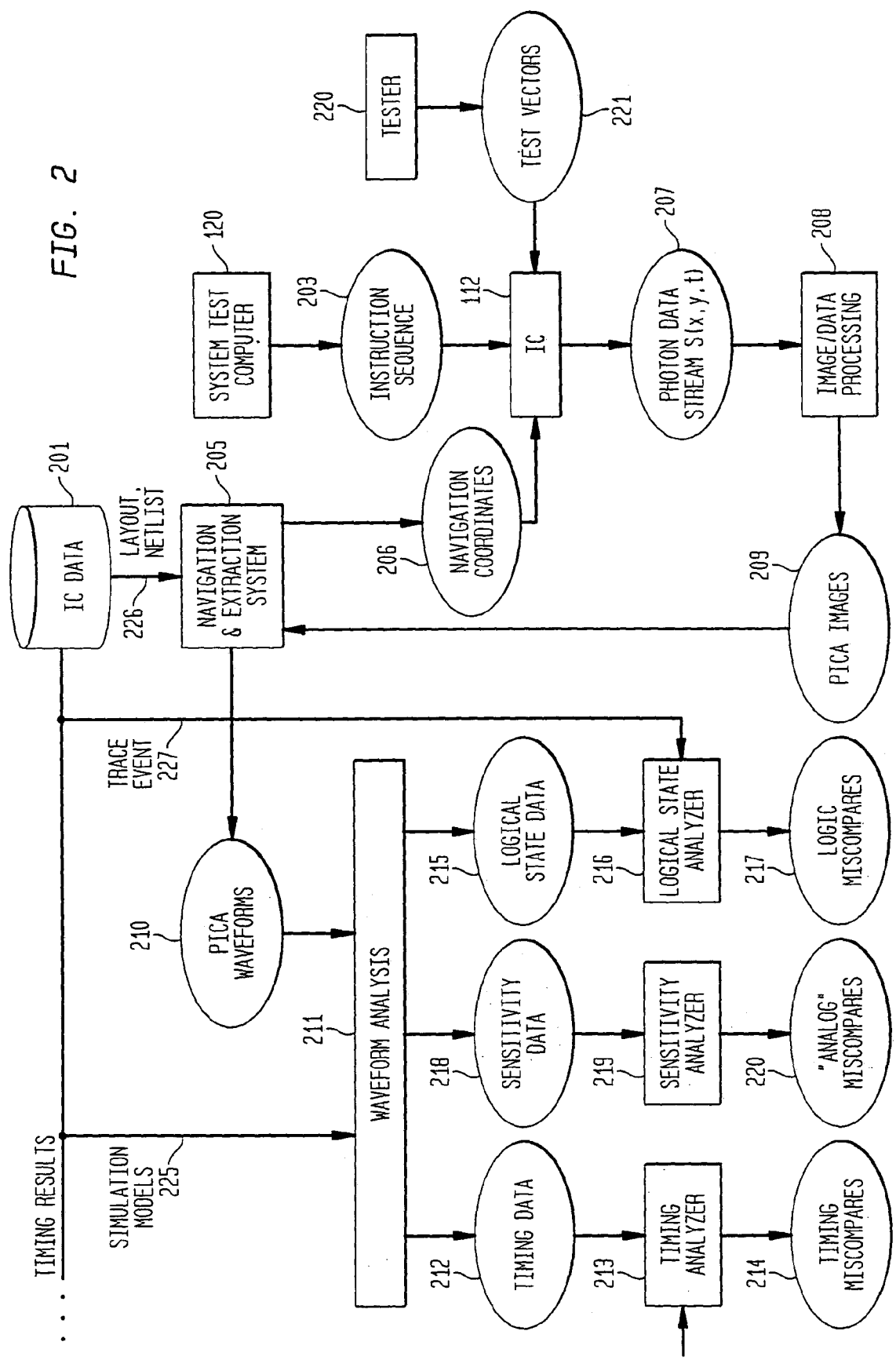
FIG. 2 depicts an example of a logic flow in accordance with the present invention.

FIG. 2 depicts an example of a logic flow in accordance with the present invention. The rectangles represent processes which may be executed manually or by a computer program and the ovals represent data and/or results. The IC (112) is shown as a shaded rectangle.

As depicted, the IC design data (201) represents various elements of conventional IC design and test data that are inputs to the system, including but not limited to, mask layout data, electrical simulation models and simulation analysis results, netlist and failure data. The failure data may be obtained by executing conventional architectural verification instructions until a failure occurs, then executing further instruction streams which are aimed at isolating the elements contributing to the failure. In the case of no known failure, the location(s) of interest may simply be a single circuit element, or multiple circuits along a suspected long, critical, or fast path.

Once a case of interest is identified, the system test computer (120) is used to generate instruction and data sequences (203) which exercise the circuit elements of interest on the IC. Alternatively, in the test environment (as opposed to system environment), a conventional IC tester (220) is used to execute test vectors (221) which exercise the circuit elements of interest on the IC (112). The instruction sequence (203) or test vectors (221) are designed to exercise the circuit elements of interest on the IC (112) in a repeatable way each N cycles from a known initial machine state. Photon emission is sampled from all circuits within the field of view for a period of time within the N cycle test such that those elements of interest are known to be switching in a repeatable manner.

The Image/Data Processing system (208) interprets the photon emission data (207) as a set of samples in three dimensions $S(x,y,t)$. Each sample represents one photon emission event, or count, in the two dimensional plane of the transistors in the IC (x,y), and in time (t). The (x,y) coordinates are referenced to an arbitrary origin within the optical field of view, which is registered to a known location on the IC. The time (t) dimension is referenced to the trigger signal so that time may be conveniently interpreted in terms of test cycles and cycle time.

In another mode of operation, the sequences (203) or test vectors (221) exercise the elements of interest, but the machine is not necessarily left in a reproducible state at the beginning (or other point) of the measurement cycle. In the latter case, a single delay for a transistor switching event is not measured, but a range of switching times is the result. The measured range, which in general will be less than or equal to the full range of the system, is also useful information. For a given instrument response and emission strength, this range is statistically related to the full potential operating range of the circuit. The statistical relationship may be estimated by Monte Carlo techniques or other well known means, but is not necessarily needed to derive useful information.

The IC layout and netlist data (226) is input into a navigation and extraction system (205), which is used to drive the positioning of the measuring apparatus and interpret the measurement results (209). A relationship is established between locations in the layout data from which emission will occur, and transistor instances in the netlist data manually or with the aid of Layout-Versus-Schematic (LVS) software. In either case, a correspondence is established between each transistor instance in the netlist and a set of bounding boxes expressed in terms of the layout coordinate system. The set of bounding boxes encloses the areas of the IC from which the corresponding transistor will uniquely contribute to light emission. The correspondence information is stored and is used to navigate to physical locations of the IC which include the emission areas of transistors to be measured. Navigation coordinates (206) are calculated for a given set of transistors to be measured by first converting the transistor instance names to the collection of areas corresponding to those transistors, computing the minimum number of measurements needed given the radius of the optical field of view, computing the center of the field of view for each measurement, and finally converting these locations from the layout coordinate system to the IC coordinate system. The navigation coordinates (206) are then given to the sample handling stage (or imaging system) to position the IC such that the field of view of the detector is centered for each measurement.

The photon stream data (207) are then gathered by the processing system (208), which can include imaging and data handling programs installed as part of the optical detection (130) and analysis (140) system, or be installed on a general purpose computer, which for the purposes of this discussion is considered part of the optical detection and analysis system depicted in FIG. 1. The system (208) generates PICA images (209) which are then fed back to the navigation and extraction system (205). The PICA images comprise the set of two dimensional histograms of the photon count, $C(x,y)$, for every element (t).

Navigation and Extraction System

The navigation and extraction system (205) extracts emission amplitude vs. time waveforms, called PICA waveforms (210), for selected regions of the image. A region from which an emission vs. time waveform is desired can be identified by a shape enclosing the desired region(s) (e.g., rectangle(s) enclosing a transistor or set of transistors). A name is created for each desired region or set of regions and photon counts, $C(x,y)$, are summed for every $(x,y)$ coordinate enclosed by the regions. This is repeated for each PICA image and each sum is paired with the value of time for that PICA image. The region name is stored along with the list of integer pairs resulting from this operation. The waveform may be visualized by plotting the $C(x,y)$ sums versus time and interpolating values between the discreet time points.

One method for generating all of the PICA waveforms of interest is to use the correspondence data previously described, which was saved and used to generate navigation coordinates for the measurements. In this case, for each transistor within the field of view of a measurement, the transistor instance name is used to name regions(s) that correspond to that transistor's set of boundary boxes. The region(s) are used to create the waveform data as described above. The result is one waveform for each transistor measured. This step may be performed manually but is preferably automated to identify many transistors in a given circuit, since the technique is inherently a parallel measurement of emissions from all of the transistors switching within the field of view.

The assignment of pixels in the image to transistors in the layout may be done semiautomatically by entering a PICA emission view or "layer" into the IC design viewer.

Figure 3:
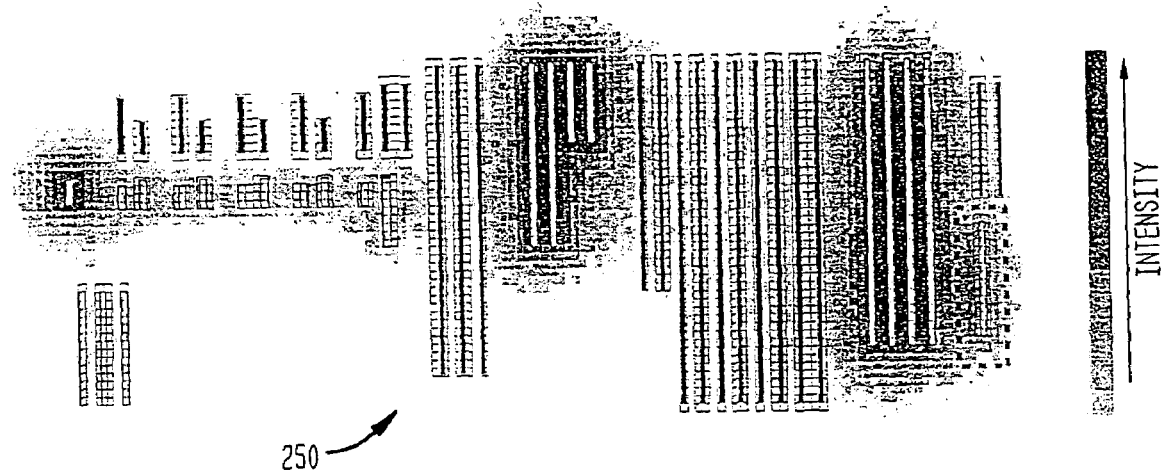
FIG. 3 shows a graphical user interface displaying image data and design data overlayed.
Figure 4:
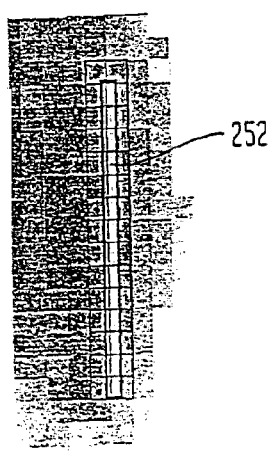
FIG. 4 is an enlarged view of a transistor element and shows the individual pixel elements constructing the emission image.

The image may be fit to the layout by appropriate scaling and rotating, and the pixel associations with the transistors then displayed. FIG. 3 demonstrates at 250 how the emission image may be overlayed with the physical deign data in a design viewer. While the Cadence design framework was employed for this demonstration, those skilled in the art would be able to transfer these principles to any commercial or non-commercial IC design viewer. The user may add or subtract pixels or regions to the transistor associations. FIG. 4 shows a close-up region depicting individual pixels 252. Waveforms are constructed from the resulting set of pixels corresponding to the transistor or set of transistors of interest. Incremental updating of the waveforms as pixels are added or subtracted will aid in the construction of optimal assignment.

It is notable in teaching the method of analysis, that areal imaging and visualization of the data for time segments, or set of time segments, is useful in the circuit interpretation, as well as in forming transistor to emission correspondences. The latter is facilitated by the time domain switching activity of the circuit elements.

Figure 5:
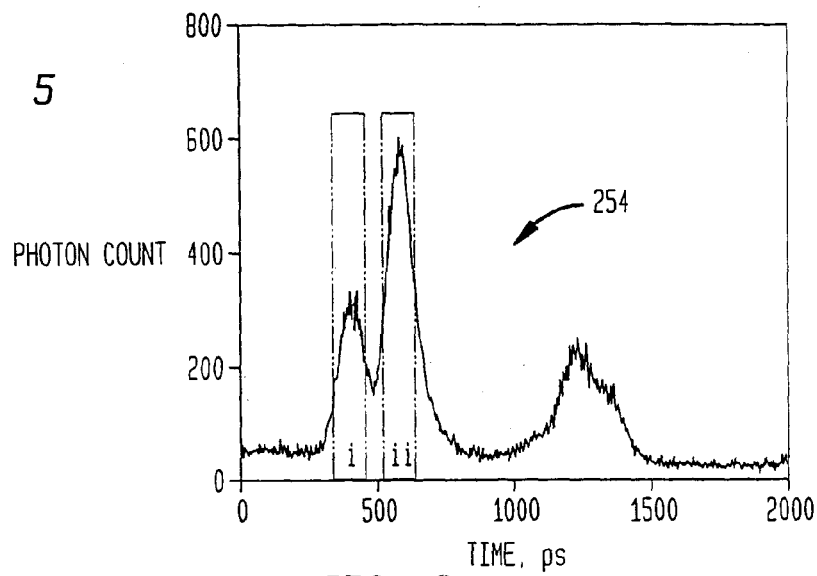
FIG. 5 illustrates a waveform corresponding to the emission data shown in FIG. 3.
Figure 6:
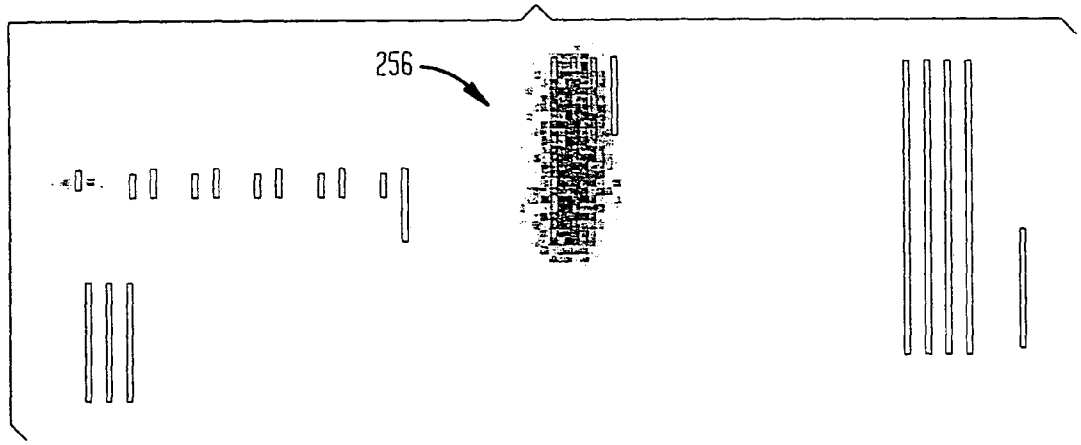
FIGS. 6 and 7 show overlayed emission images corresponding to portions of the waveform of FIG. 5.
Figure 7:
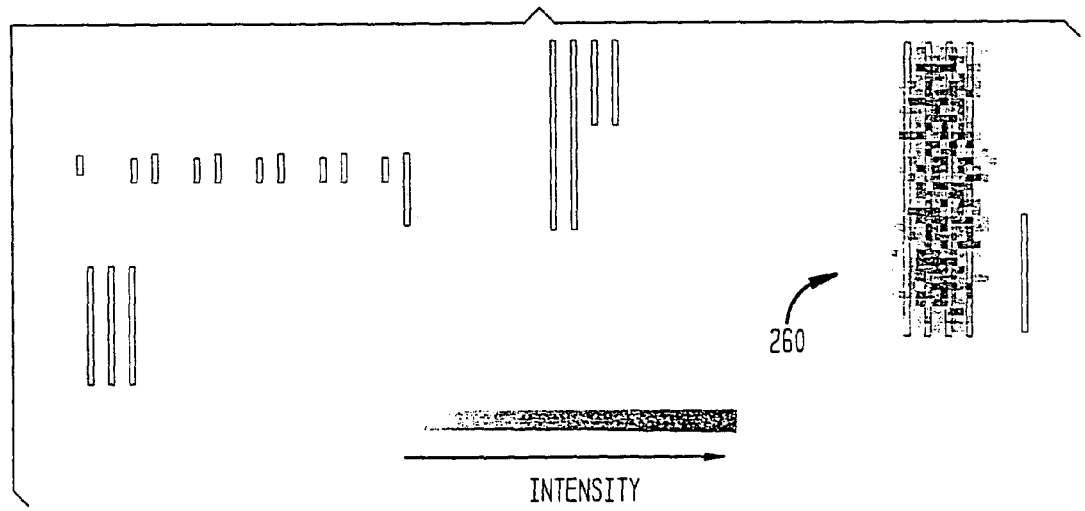
Figure 8:
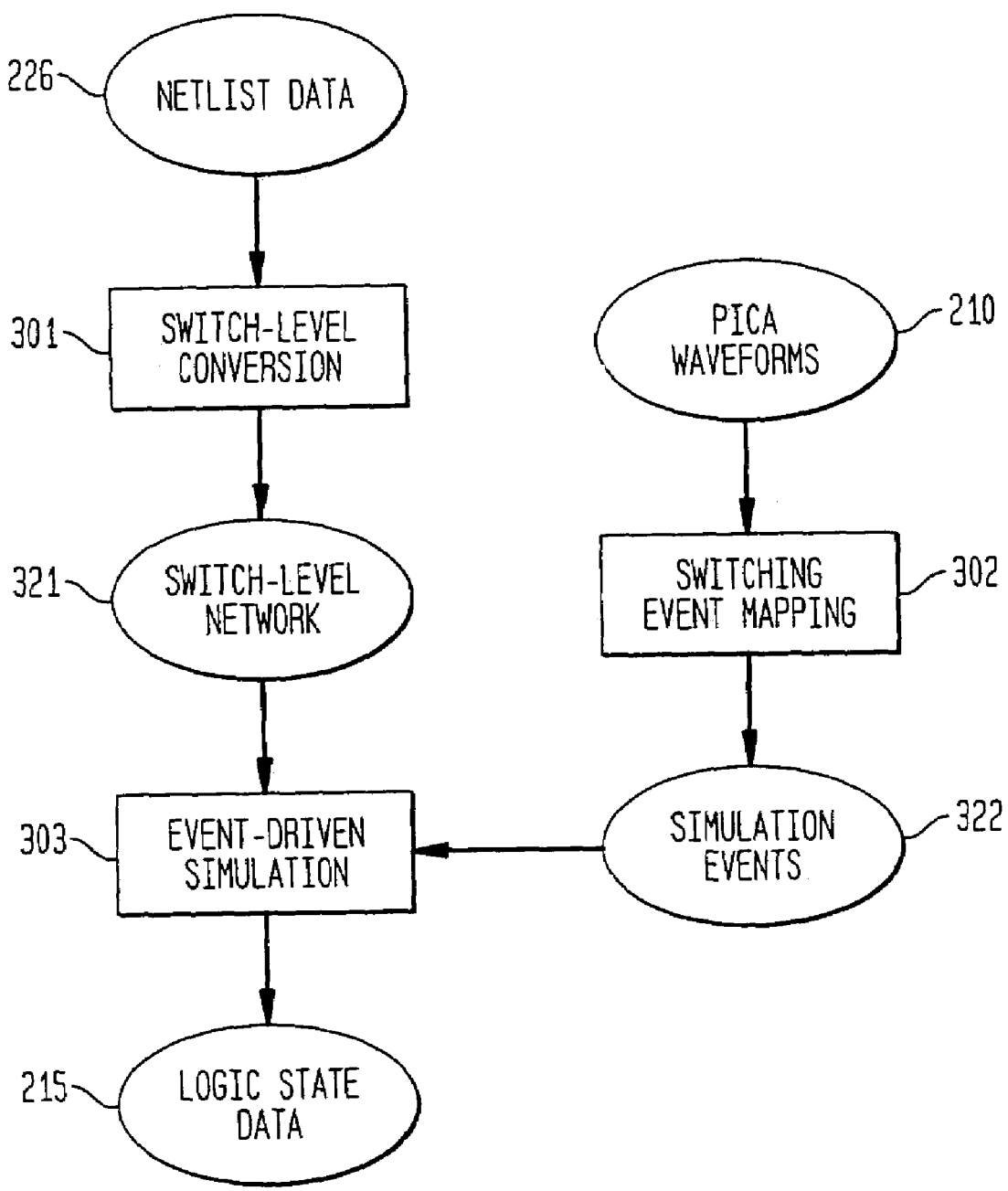
FIG. 8 depicts an example of a method for converting the emission data into logic state data.
Figure 9:
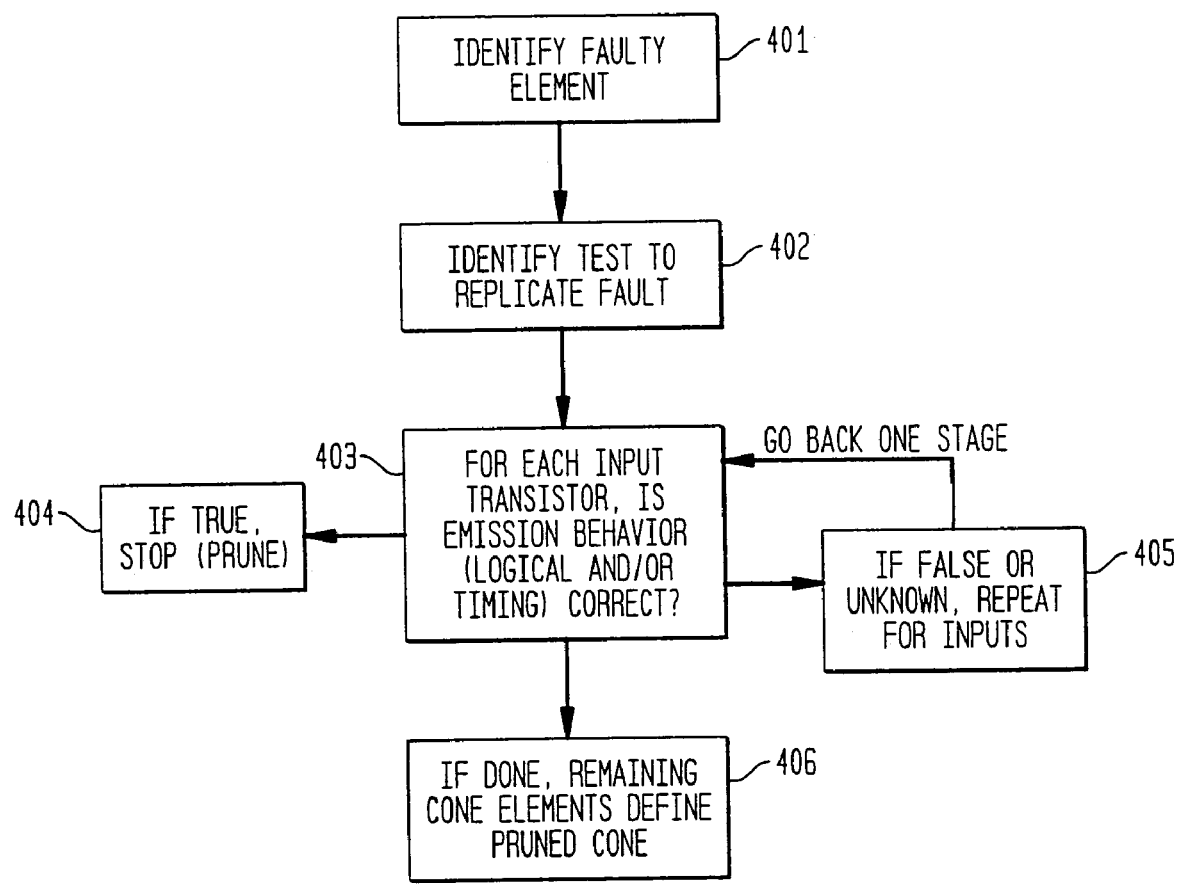
FIG. 9 is a flowchart illustrating a conetracing procedure using the timing and/or logic analysis employed in the present invention.

A preferred embodiment of the system relates the image views to the waveform viewer such as to allow time and/or space domain cross probing. This enables the image viewer to show the emissions that occurred in a certain interval. FIG. 5 show the full waveform 254 corresponding to the emissions FIG. 3. The waveform 254 shows two time intervals, (i) and (ii), for which the corresponding emission image overlays are shown at 256 and 260 in FIGS. 6 and 7, respectively. For simplicity, the PFET devices are not shown in the physical design overlay since most of the signal for this example originates from the nFET devices.

The image may also be probed to define a region for which a corresponding waveform be viewed. In a preferred embodiment, a graphical user interface allows the user to indicate the region, such as extrema of a rectangle, or collection of rectangles or other shapes. The waveforms corresponding to emissions from the selected region or regions are displayed on the waveform viewer. In a further embodiment, such probing from between image and waveform views may be incrementally and the system will remember previous probing events and correspondingly initialize the data sets. In another embodiment hierarchical image and/or waveform views are available from the IC viewer to correspond to the design hierarchy.

Known image to test image comparison (see U.S. Pat. No. 6,172,512 issued Jan. 9, 2001 to the same assignee) may be performed in such time segment domains. It would be obvious to one knowledgeable in the fields of test and diagnostics that when failing and passing conditions are created by changing the frequency of test, scaling the data acquisition time to account for the difference in duty cycles will help to acquire a clean subtracted image.

Waveform and Timing Analysis

Returning to FIG. 2, the PICA Waveforms (210) are input to the Waveform analysis stage along with the simulation models and analysis results (225). Waveform analysis may be performed manually or automated (see U.S. Pat. No. 6,125,461 issued Sept. 26, 2000 to the same assignee). Goals of the analysis include generation of timing data (212) for characterization and analysis of IC timing operation, generation of logical state data (215) for reconstructing and analyzing the logical operation of the circuits withing the IC, and generation of sensitivity information (218) for characterizing and analyzing circuit sensitivities.

One example of manual waveform analysis is translating the set of available PICA waveforms into the same digital form (rawspice format) which is commonly output from analog simulators, such as Spice, and visually comparing the measured waveforms (PICA waveforms) to simulated waveforms (Spice waveforms) using a waveform display program, such as Nutmeg.

A particular example of waveform and timing analysis is clock distribution analysis and skew characterization. Valuable information about clock distribution timings may be gathered by measurement at the full chip field as well as by using a set of measurements taken using magnification optics and relating the set of measurements together by recognizing a common timebase. While this example is covered by the preceding general discussion, it is an important case since clock skew characterization is desired for every high performance IC such as microprocessors.

Wide field measurements in this case makes use of the aforementioned method for delineating switching transistors by analysing the time sequence of switching activity in the emission waveforms. Even while the transistors comprising a clock distribution may be large, typically several transistors may occupy the space comprising a broad emission so correlating the sequence of events between image and waveform views is important in analysing the results. Also, one or both edges of the clock pulse may be important for timing. The events corresponding to each edge must be recognized and assigned as belonging to that edge, such as belong to the rising edge of the input clock signal, or as belonging to the falling edge of the input clock signal. If a single edge is relevant to the operation of the chip, then electronic removal of the data belonging to the other edge may be useful to simplify the visualization and thereby simplifying analysis. This is especially helpful in simplifying the appearance of the waveform data to aid in analysis.

Waveform analysis may automatically generate timing data (212) by comparing a simulation model used for timing analysis to the PICA waveforms. For every transistor found in the PICA waveforms, a matching transistor is found in the timing simulation model. Next, for every path in the timing simulation model for which there is a switching time generated, a switching time is calculated for that path from the waveform data. The calculation is performed by determining from the simulation model every transistor that is included in the path, then subtracting the time that the transistor driving the first transistor in the path switched from the time that the last transistor in the path switched. This calculation may be aided by implementing a number of algorithms that improve determination of precise switching times. Examples of such algorithms include edge and peak detection algorithms and cross-correlation between waveforms.

The timing data (212) is analyzed by the timing analyzer (213) to extract timing violations by comparing the extracted timing data to expected transition occurrences such as by comparing the calculated IC timings as described above to the timing simulation results. The timing simulation results include both the required (maximum or minimum) path delay times for each simulated path, and the calculated timings of those paths from the simulation model. When a calculated path delay is greater than a required maximum path delay or less than a required minimum path delay, the result indicates that the IC may not operate within its specifications. When a calculated path delay is within the required minimum or maximum delay, but varies from the simulated delay for that path, it may indicate a problem with the simulation model used for timing, anomalous behaviour of the circuits which include the measured path, or an unknown component contributing to the timing. An example of a method comprising comparison to hardware reference data is described in commonly owned and co-pending U.S. patent application Ser. No. 09/026,287, entitled "Image Processing Methods for the Optical Detection of Dynamic Error in Integrated Circuits" filed on Feb. 19, 1998, which is hereby incorporated by reference herein in its entirety.

Alternatively, the timing analysis (213) can be done with the aid of a program adapted to flag timing violations (214) by detecting peaks exceeding a predetermined threshold; and compare transition times and measure and flag delay variations beyond a predetermined threshold, which can be defined for each element, or family of elements. Whether manually or automatically found, the timing miscompares (214) constitute an output of the described sequence.

Logical State Analysis

The PICA waveforms (210) can also be analyzed (211) to determine logical state data (215) as a function of time. The logic state of a combinational logic circuit may be defined as the logical (0 or 1) value of every output of the circuit. The logic state of a sequential logic circuit may be defined at the logical (0 or 1) state of every output and every storage node of the circuit. For CMOS circuits, it is generally the case that an output or storage node is defined to be in the "0" state when the node capacitance is discharged to ground, and is in the "1" state when the node capacitance is charged to the supply rail. Such charging and discharging events may be detected with the PICA waveforms.

Referring now to FIG. 3, an example of a method for converting the PICA waveforms (210) into logic state data (215) is depicted. This provides a means to perform the logic state analysis (216) and understand the logical behavior— e.g., identify logical state violations (217)—of complex IC devices.

As depicted in step (301), netlist data (226) is parsed and the device connectivity information and transistor type and dimension information are used to construct a network of switches (321). A mapping of nets in the input netlist which contact transistor gates to corresponding nodes in the switch-level network is recorded. The type of switch is determined by the type of transistor, N or P type, connected to the node. The strength of a transistor is defined as a ratio of the transistor width to length.

Determination of logic state from switching events in such a network is well known and practiced by those familiar in the art. One use of this technique is in switch-level simulation. In switch-level simulation, a transistor-level netlist is input and each transistor is converted into a switch, which may be either "open" or "closed". The nodes connected to the source and drain of each transistor are connected similarly to the ends of the switch. A node in the netlist which represents the power rail is provided a constant value of "1" in the switch network, and a node in the netlist which represents ground is provided a constant value of "0" in the switch network. The value of the node connected to the gate of an N-type transistor is used to open or close the switch. The switch opens when the logical value of the node changes to a "1" and closes when the logical value of the node changes to a "0". In a similar fashion, the value of the node connected to the gate of a P-type transistor is used to close the switch when the logical value changes to a "1" and to open the switch when the logical value changes to a "0". In the event that both a "0" and a "1" becomes connected to a node through two or more switches, the strength of the switches determines the value of the undetermined node.

It is convenient to initially set all nodes in the switch network to a value of "unknown". When the logical value of an input node to a switch is "unknown", then it is not known if the switch is "open" or "closed". Next, a subset of the nodes in the network may be changed from the "unknown" state to either a "0" or "1" state. The change in value on these nodes will cause some switches to open or close. A closed switch will pass a constant value of "0" or "1" on one of its nodes to the other node and an open switch will leave the value of both nodes unchanged. The process repeats for switches connected to the nodes that have changed value. This is known as event-driven simulation.

A similar technique may be used to improve the accuracy and generality for determining logic state from PICA waveforms. The same switch-level network is used for the simulation, but events are scheduled on switches based on the measured switching activity of the transistors.

A recording of the transistor switching information in the form of PICA Waveforms (210) is input and ordered by ascending time of switching events. Starting at the earliest time that a switching event occurred, all simultaneous switching events are collected and mapped to switches in the switch-level network (302). The mapping is performed by relating each PICA Waveform (210), which is a recording of switching events of a single transistor, to the switch in the switch-level network that corresponds to the same single transistor as determined by Switch-level conversion (301). The resulting set of simultaneous switching events becomes one simulation event to be input for Event-Driven Simulation (303). The process is repeated for all remaining switching events extracted from the PICA Waveforms (210), and the order in time of the simultaneous switching events is recorded along with the mapped switching events themselves. Collectively, these recordings become the Simulation Events (322) to be simulated with the Event-Driven Simulation (303)

Event-Drive Simulation (303) is then used to calculate the logic state of the switch-level network from the simulation events. For each set of simultaneous switching events recorded in the Simulation Events (322) the repeated process of determining logic values at the nodes of the network is performed. When a switching event is detected in a P type transistor, it indicates that the node connected to the drain port of the transistor is charged to the supply rail. When a switching event is detected in an N type transistor switches, it indicates that the node connected to the drain port of the transistor is discharged to ground. The state of a node at a particular point in time may be determined by finding the type of device (N or P) which most recently switched. Event-driven simulation completes the calculation of logical values on nodes in the network. This is repeated for every set of simultaneous switching events recorded in the Simulation Events (322). The resulting set of logical node values, ordered in time, is stored as Logic State Date (215), which may be conveniently compared to logic trace data from software simulations.

In the manner described above, switching events can be converted to logic values using known algorithms. According to the present invention, however, instead of scheduling switching events based on changes to the logical state of the network, recorded switching events are input to the algorithms. The initial state of all nodes in the logical network are all initialized to a value of "unknown". The logical values "0" and "1" replace the initial value when a recorded switching event determines that a node or nodes in the network is set to that value.

The process is repeated for all of the events in the switch recording. Throughout the process records are preferably kept of every logical value of selected nets in the mapping file.

Returning again to FIG. 2, the logical state data (215) includes both the PICA derived switch level waveforms for the device under test and the expected (modeled) switch behavior, e.g., from a known good device. The switch level behavior for the test device can be compared against expected behavior either manually (227) or automatically by the logic state analyzer (216) to identify logical state violations (217). The logic state analyzer (216) receives the modeled switch level waveforms and compares them against the switch level waveforms derived from PICA. When non-correspondences occur at given time intervals, the logic state analyzer (216) outputs the logic state violations (217).

Sensitivity Analysis

Sensitivity analysis (218) represents an analysis of the PICA waveforms for their analog behavior, e.g., by employing a shape analysis thereof. This could be either a manual analysis or automatic waveform analysis interpreting and comparing the shape of the waveforms against expected behavior. This could be a comparison against simulated models (225). Thresholding to identify features such as bumps can be performed as part of the sensitivity analysis (218) to identify emissions which are present but not expected, or fall outside the expected height range. Sensitivity flags (219) can be set to identify suspicious behavior. The occurrences of analog miscompares are output (220).

Conetracing

Conetracing, a diagnostic means for tracing a logic error, may be assisted by the timing and/or analysis previously described, or may be performed manually or semi-manually. The flowchart for conetracing is shown in FIG. 4. Here, a failure or suspicious timing occurrence would be identified at a scannable latch bit or other circuit element (401). The test to stimulate the same fault to occur which is consistent with the system and the method is formulated (402). Then, stage by stage forward of the failed latch, the occurrences of switching events would be traced. If the emissions indicate the correct behavior (403), then the emissions for the transistors one stage forward would be analyzed, and so forth. If an improper behavior is indicated at a given transistor, and proper behavior is indicated at a another transistors, then the logic cone forward of the properly behaving transistor may be "pruned" from the investigation (404), thereby simplifying the problem. Investigation would continue along the cone which feeds the improperly behaving transistor (405). Continued backtracking and pruning all the way to the base of the cone will reduce the problem to a set of elements contributing to the failure (406). In a scan-based test methodology, the base of the cone would be a set of scannable latches. For non scan-based designs, the base will be a set of primary input pins. This method does not require that each switching transistor have measurable emission. Switching behavior before and after the nonmeasureable transistor can be used to deduce the logical behavior of the unknown transistor. Pruning would be restricted for those branches leading to known transistor switching behaviors measured by the system.

While the invention has been particularly shown and described with respect to preferred embodiments thereof, it will be understood by those skilled in the art that the foregoing and other changes in form and details may be made therein without departing from the spirit and scope of the invention.

Having thus described our invention, and what we claim as new and desire to secure by Letters Patent is:

1. A method for characterizing switching behavior in an Integrated Circuit (IC), comprising:
generating and applying signals to an IC to cause repeated switching activity in a region of interest in the IC, wherein said switching activity generates emissions from said region of interest to identify individual switching events; and
resolving the switching activity in both space and time.

2. A method for characterizing circuit activity in integrated circuits (IC), comprising:
generating and applying signals to an integrated circuit (IC) to cause repeated switching activity in a region of interest in the IC, wherein said switching activity generates emissions from said region of interest;
recording data values identifying locations and times of said emissions to identify individual switching events;
assigning the emissions to circuit elements or devices in the region of interest;
processing the recorded data values to create emission waveforms; and
analyzing the emission waveforms to characterize switching activity of individual circuit elements or devices in the region of interest.

3. The method according to claim 2, wherein the signals are instruction sequences applied into memory elements of the IC under system operations, and the signals initiate execution of a sequence loop to cause repeated stimulation of circuit elements or devices in the region of interest.

4. The method according to claim 2, wherein the signals are a set of vectors or inputs applied to primary inputs of the IC.

5. The method according to claim 2, wherein said switching activity generates optical emissions, and the recording step includes the step of recording time resolved optical emissions generated by the switching activity.

6. The method according to claim 2, wherein the assigning step includes the step of using a layout vs. schematic (LVS) extraction to assign the emissions to the circuit elements or devices.

7. The method according to claim 2, wherein the assigning step includes the step of automatically assigning the emission to the circuit element using information from a LVS extraction.

8. The method according to claim 2, wherein the assigning step includes the step of semiautomatically assigning the emissions to circuit elements by having a user add or subtract circuit elements to the region of interest.

9. The method according to claim 2, wherein the analyzing step includes the steps of:
analyzing the emission waveforms to identify timing and/or logic behavior; and
comparing said timing and/or logic behavior to behavior expected from electrical circuit stimulation.

10. The method according to claim 2, wherein the analyzing step includes the steps of:
analyzing the emission waveforms to identify logic behavior; and
comparing said logic behavior to behavior expected from logic stimulation.

11. The method according to claim 2, wherein the analyzing step includes the steps of:
using a known good circuit to obtain standard waveforms and/or image sequences; and
comparing the emission waveforms to said standard waveforms and/or image sequences.

12. A system for characterizing switching behavior in integrated circuits, comprising: means for generating and applying signals to an intergrated circuit to cause repeated switching activity in a region of interest in the intergrated circuit, wherein said switching activity generates emissions from said region of interest; and a means for resolving the switching activity in both space and time.

13. The system according to claim 12, further comprising an IC design viewer which provides a means to view the measured switching activity spatially and/or temporally.

14. The system according to claim 13 further comprising means to identify and thereby relate the switching devices/circuits between the IC design viewer representations.

15. The system for characterizing circuit activity in integrated circuits, comprising: means for activating an Integrated Circuit or system of Integrated Circuits, means for detecting and recording individual switching activities the Integrated Circuits, a means of representing the switching activities of individual circuit elements of the intergrated circuits such that the switching activities of the individual circuit elements can be characterized and an intergrated circuit design viewer which provides a means to view the recorded switching activity spatially and/or temporally, and
where the switching data is comprised of photon emissions and the intergrated circuit design viewer is enabled to display emission images.

16. The system according to claim 15, where the emission image(s) is(are) related to the design data (physical layout and/or circuit schematic and/or netlist).

17. The system according to claim 16 where emission waveforms are generated by a program from the areal designations per transistor, device, or circuit.

18. The system according to claim 17 where the emissions waveforms are generated automatically when the user selects the option from the IC viewer control panel.

19. The system according to claim 17 where the waveforms are generated automatically from the areal designations and are available for view either automatically or when requested, from the IC viewer.

20. The system according to claim 15 where pixels, or other such units of areal designation are assigned to transistors or devices or circuits.

21. The system according to claim 20 where the pixels, or other such unit of areal designation, are assigned automatically by relating to the areal transistor/device/ckt designations.

22. The system according to claim 20 where the pixels or other such units of areal designation are adjusted semiautomatically by a user interface whereby the user may indicate the pixels or regions desired for removal from, or addition to, the set of pixels or regions assigned to the device or transistor.

23. The system according to claim 22 where the graphical user interface enable "point and click" selection and deselection of pixels or regions.

24. The system according to claim 22 where the graphical user interface shows questionable pixel or region designations where the user may wish to provide a choice.

25. The system according to claim 24 where the waveform viewer and emission viewer are related and are cross probable.

26. The system according to claim 15 where emission waveforms are viewable from the IC viewer.

27. The system according to claim 26 where the waveforms and/or images are further viewable according to the design data hierarchy.

28. The system according to claim 15 wherein clock distribution analysis and skew characterization is included.

29. The system according to claim 15 wherein areal regions are related to a common time-base by designation of a timing reference such as a reference signal contained in each region.

30. The system according to claim 29 which electronically combines regions to create a whole, or combined, visualization; the combined visualization may be in the form of a vide, still images, or waveforms.

31. The system for characterizing circuit activity in integrated circuits, comprising:
means for generating and applying signals to an integrated circuit (IC) to cause repeated switching activity in a region of interest in the IC, wherein said switching activity generates emissions from said region of interest;
means for recording data values identifying locations and times of said emissions to identify individual switching events;
means for processing the recorded data values to create emission waveforms; and
means for analyzing the emission waveforms to characterize switching activity of individual circuit elements or devices in the region of interest.

32. The system according to claim 31, further comprising a processor board for mounting the IC.

33. The system according to claim 31, wherein the means for receiving the emissions includes an optical emission measurement system.

34. The system according to claim 31, wherein the means for generating and applying the signals includes a system test computer.

35. The system according to claim 31, wherein the analyzing means includes a computer.

36. The system according to claim 31, wherein the means for generating and applying the signals includes an integrated circuit tester.

37. The system according to claim 31, wherein the analyzing means includes an input for receiving a normal time-range input by a user.

38. The system according to claim 31, wherein the analyzing means includes a software utility for supplying normal time ranges.

39. The system according to claim 31, wherein the analyzing means includes:
means for recording an expected behavior, including means for extracting from the waveforms a transition of a circuit element or device from a first state to a second state, and for recording an expected time for said transition from the application of a predetermined one of the signals.

40. The system according to claim 31, wherein the region of interest includes input and output nets, each of the input and output nets having a logic state, and wherein the analyzing means includes means for recording a transition expected from the logic states at the input and output nets at a given time determined by a gate level simulation of the IC.

41. The system according to claim 31, wherein the analyzing means includes means for flagging the occurrence of predefined peaks or the absence of predefined peaks, and said flagging means includes a software utility that compares the emission waveform to expected behavior data stored in a computer file.

42. The system according to claim 31, wherein:
the analyzing means includes means for flagging emissions that occur at wrong times; and
said flagging means includes a software utility that compares the times of switching activity to expected times stored in a computer file, and that checks to determine if the switching activity is in a previously defined acceptable range.

43. The method for analyzing an integrated circuit, comprising:
detecting a fault in the circuit;
applying known stimulus to the circuit to reproduce the fault and to localize the fault to a component of the circuit;
collecting time resolved light emissions from the circuit component to identify individual switching events;
analyzing the collected time resolved light emissions to extract switching and timing data about the circuit component; and
extracted switching and timing data about individual circuit elements in the component of the circuit, and comparing the extracted data to expected switching and timing behavior data to characterize the fault.

44. The method according to claim 43, wherein the comparing step includes the step of comparing extracted data to expected behavior data to identify (i) missing switching events, and (ii) switching events that should not have occurred.

45. The method according to claim 43, wherein the comparing step includes the step of comparing extracted data to expected behavior data to detect early switching events and late switching events.

* * * * *